United States Patent
Wagner et al.

(10) Patent No.: US 10,879,460 B2
(45) Date of Patent: Dec. 29, 2020

(54) METHOD OF FORMING A METALLIC CONDUCTIVE FILAMENT AND A RANDOM ACCESS MEMORY DEVICE FOR CARRYING OUT THE METHOD

(71) Applicant: Univerzita Pardubice, Pardubice (CZ)

(72) Inventors: Tomas Wagner, Pardubice (CZ); Bo Zhang, Pardubice (CZ)

(73) Assignee: Univerzita Pardubice, Pardubice (CZ)

( * ) Notice: Subject to any disclaimer, the term of this patent is extended or adjusted under 35 U.S.C. 154(b) by 6 days.

(21) Appl. No.: 16/469,161

(22) PCT Filed: Feb. 21, 2018

(86) PCT No.: PCT/CZ2018/050006
§ 371 (c)(1),
(2) Date: Jun. 13, 2019

(87) PCT Pub. No.: WO2019/161815
PCT Pub. Date: Aug. 29, 2019

(65) Prior Publication Data
US 2020/0243762 A1 Jul. 30, 2020

(51) Int. Cl.
*H01L 45/00* (2006.01)
*G11C 13/00* (2006.01)

(52) U.S. Cl.
CPC ........ *H01L 45/085* (2013.01); *G11C 13/0011* (2013.01); *G11C 13/0069* (2013.01); *G11C 13/0097* (2013.01); *H01L 45/1233* (2013.01); *H01L 45/1266* (2013.01); *H01L 45/142* (2013.01); *H01L 45/143* (2013.01); *H01L 45/146* (2013.01); *H01L 45/1641* (2013.01); *G11C 2013/0083* (2013.01); *G11C 2213/32* (2013.01); *G11C 2213/52* (2013.01)

(58) Field of Classification Search
CPC combination set(s) only.
See application file for complete search history.

(56) References Cited

U.S. PATENT DOCUMENTS

| | | |
|---|---|---|
| 2006/0181920 A1 | 8/2006 | Ufert |
| 2008/0273370 A1 | 11/2008 | Keller et al. |
| 2011/0084248 A1 | 4/2011 | Hsieh |
| 2015/0078065 A1 | 3/2015 | Vianello et al. |
| 2019/0272874 A1* | 9/2019 | Dananjaya .......... H01L 45/1233 |

* cited by examiner

*Primary Examiner* — Ratisha Mehta
(74) *Attorney, Agent, or Firm* — Mark M. Friedman

(57) ABSTRACT

A random access memory device (400) comprises inert-inert electrode cell (210) and inert-active electrode cell (110). The inert-inert electrode cell (210) and inert-active electrode cell (110) are connected in series in a serial connection. The inert-inert electrode cell (210) comprises a top inert electrode (200), an electrolyte (202) and a bottom inert electrode (206), the inert-active electrode cell (110) comprises a top active electrode (100), an electrolyte (102) and a bottom inert electrode (106). The bottom inert electrode (200) of inert-inert electrode cell (210) is connected with negative electrode of voltage source (300) and the top active electrode (100) of inert-active electrode cell (110) is connected with positive electrode of voltage source (300).

2 Claims, 12 Drawing Sheets

METHOD OF FORMING A METALLIC CONDUCTIVE FILAMENT AND A RANDOM ACCESS MEMORY DEVICE FOR CARRYING OUT THE METHOD

FIELD OF THE INVENTION

The invention generally relates to an electrochemical metallization based random access memory (RRAM) device, applied in non-volatile arrays. More specifically, the electrochemical metallization (ECM)-based device comprises two inert electrodes, which can be operated in bipolar mode, either with another normal ECM-based device or individually.

BACKGROUND OF THE INVENTION

Random access memory (RRAM) device utilized two different resistance states to store the data Information. The mechanism of RRAM device can be divided into nano-chemical mechanism, molecular switching mechanism, valence change mechanism, thermochemical mechanism, phase change memory mechanism, magnetoresistive mechanism and ferroelectric tunneling mechanism. Classic electrochemical metallization (ECM) based device comprise an inert electrode, an active electrode and one metal doped electrolyte, which the inert electrode can be fabricated with Al, Pt or W and active electrode can be fabricated with Ag or Cu. The metal doped electrolytes are mainly Ag or Cu doped chalcogenide compounds, for instance Ag—Ge—Se, Cu—Ge—Se, and $Ag_2S$. Other oxide material, for instance $WO_N$, $SiO_2$, $ZrO_2$, $Ta_2O_5$ and $HfO_2$, are also found to be used as electrolyte in ECM based device. Nevertheless, the structure of ECM based device in crossbar geometry is different from the classic structure, for instance $Al/SiO_2/Ag$—Ge—Se/Ag. The function of $SiO_2$ layer refers as "buffer layer", which makes the resistive switching more stable.

ECM based device is commonly operated in bipolar mode. During SET operation, Ag or Cu active electrode is positively biased and Ag or Cu begins to be oxidized and diffused into electrolyte. Meanwhile, the inert electrode is negatively biased; the ions from electrolyte are reduced to metallic conductive filaments which connects the inert and active electrode. Therefore, the resistance decreases and the threshold voltage is referred as SET voltage. During RESET operation, the Cu or Ag electrode is negatively biased, and ions from electrolyte are reduced there. Meanwhile, the inert electrode is positively biased and the filaments begin to be dissolved. Therefore, the resistance of the device is turned to be high, and the voltage threshold is referred as RESET voltage.

The ECM based RRAM device owns superb properties, for instance good scalability (<20 nm), low operational current (<1 nA) fast operational speed (<5 ns) and good endurance ($>10^8$ times). However, the active electrode (Ag or Cu) in classic ECM device is vulnerable to thermal or photo treatment. Therefore, during aging of device, the Ag or Cu element would continuously dissolve into the electrolyte, causing the detachment between the active electrode and electrolyte. Moreover, thanks to the continuous dissolution of Ag or Cu from active electrode, the concentration of Ag or Cu dopants will be increased. The two reasons above cause the failure of device and limit the development of ECM based RRAM device.

In order to avoid to excessive dissolution of active electrode into electrolyte, both electrodes must be fabricated with inert electrode. However, the device with both inert electrodes is often used in VCM (valence change mechanism) based device, which can only be operated with unipolar mode.

SUMMARY OF THE INVENTION

This task has been resolved by development of a method of forming a metallic conductive filament in an ECM based device according to present invention.

The dissolution of active electrode often leads to the failure of device. Nevertheless, an ECM based RRAM device can be fabricated with both inert electrodes. An aspect of the invention creates a combination of cells in a single device, which makes possible for a single ECM based cell working with two inert electrodes.

There are two methods of forming a metallic conductive filament in an ECM based device:

Method 1: The ECM based device comprises an inert-inert electrode cell and an inert-active electrode cell. The inert-inert electrode cell and the inert-active electrode cell are connected in series in a serial connection. The inert-inert electrode cell comprises a bottom inert electrode which is connected with a negative electrode of a voltage source and the inert-active electrode cell comprises a top active electrode of which is connected with a positive electrode of the voltage source. Initially, the inert-active electrode cell in the ECM based device is preset to low resistance under a bias which is higher than the SET threshold bias in a separated circuit, in order to have thick filament. During the SET process of device, as the inert-active electrode cell has been in low resistance state, only the inert-inert electrode cell is switched from high resistant state to low resistant state at the SET threshold bias. The Ag ions in the electrolyte of the inert-inert electrode cell are reduced to Ag filament. Meanwhile, the Ag active electrode in inert-active electrode cell is oxidized into Ag ions and migrated into electrolyte of the inert-active electrode cell. And the filament in the inert-active electrode cell is thicker than that in the inert-inert electrode cell. Therefore, the filament in the inert-inert electrode cell dissolves other than that in the inert-active electrode cell, during RESET process.

Although the resistance of the inert-active electrode cell in the device can be switched to high resistant state during RESET process, there is still Ag remaining in the electrolyte, which functions as Ag electrode. Therefore, the inert-active electrode cell with double inert electrodes can be switched individually in separated circuit, between high and low resistant states.

Method 2: The ECM based device comprises an inert-inert electrode cell and an inert-active electrode cell. The inert-inert electrode cell and the inert-active electrode cell are connected in series in a serial connection. The inert-inert electrode cell comprises a bottom inert electrode which is connected with a negative electrode of a voltage source and the inert-active electrode cell comprises a top active electrode of which is connected with a positive electrode of the voltage source. Initially, the inert-active electrode cell in ECM based device is maintained as the original high resistance state. During the SET process of device, both of the inert-inert electrode cell and the inert-active electrode cell is switched to low resistance state. After SET operation of device, the inert-inert electrode cell has to be reset to high resistive state individually in separated circuit. Then it can be switched between high and low resistance states continuously in the separated circuit.

In this contest, in an embodiment of the present invention, there is provided a random access memory device for carrying out the above-mentioned methods, wherein the random access memory device is an ECM based device comprising:

Inert-inert electrode cell, wherein the bottom inert electrode of inert-inert electrode is in contact with the negative polarity of voltage source.

Inert-active electrode cell, where the bottom inert electrode of inert-active electrode cell is in contact with the top inert electrode of inert-inert electrode cell, where the top active electrode of inert-active electrode cell is in contact with the positive polarity of voltage source;

Inert-inert electrode cell comprising: top inert electrode, electrolyte and bottom inert electrode, where the inert electrodes can be made of conductive oxides, conductive nitrides, or metals and its combinations except for Ag and Cu; the Ag or Cu doped electrolyte can be Ag or Cu doped oxides or chalcogenides thin film.

Inert-active cell comprising: inert top electrode, electrolyte and active bottom electrode, where the inert electrodes can be made of conductive oxides, conductive nitrides, or metals and its combinations except for Ag and Cu; the active electrodes can be made of Ag or Cu element; the Ag or Cu doped electrolyte can be Ag or Cu doped oxides or chalcogenides thin film.

BRIEF DESCRIPTION OF DRAWINGS

The invention will be explained in detail by means of the drawings.

PREFERRED EMBODIMENTS OF THE INVENTION

Figure 1:
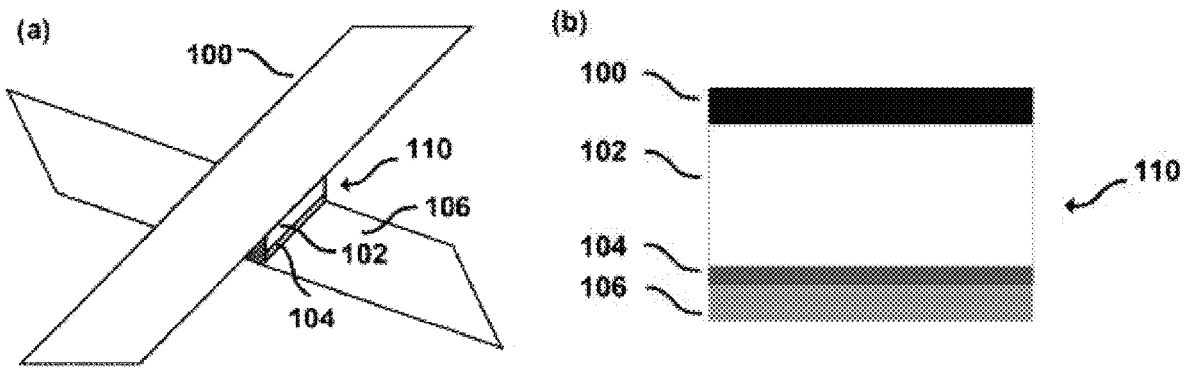
FIG. 1 illustrates a cross sectional view of the inert-active electrode cell.

FIGS. 1 (a) and (b) are a 3-D and 2-D cross sectional view of inert-active electrode cell 110 from the prior art. The inert-active electrode cell 110 comprises top active electrode 100, electrolyte 102, buffer layer 104, and bottom inert electrode 106. The cell 110 is in crossbar geometry. And the top active electrode 100 and the bottom inert electrode 106 are in a cross-sectional configuration, where the area of crossing point is 100 µm×100 µm. The bottom inert electrode 106 was made of first layer of Al and was evaporated (thickness: 50 nm) onto glass substrate through stencil mask. The ultra-thin buffer layer 104 of $SiO_2$ was sputtered (thickness: 3-5 nm) onto the Al bottom inert electrode 106. And then followed the GeSe layer was evaporated with 100 nm thickness. Then an ultra thin layer (thickness: 10 nm) of Ag was evaporated onto the GeSe layer. During this step, as the slow evaporation speed, the Ag was directly dissolved into GeSe, forming AgGeSe layer of electrolyte 102. Finally, the top Ag active electrode 100 was evaporated (thickness: 100 nm) onto the top of thin film.

Figure 2:
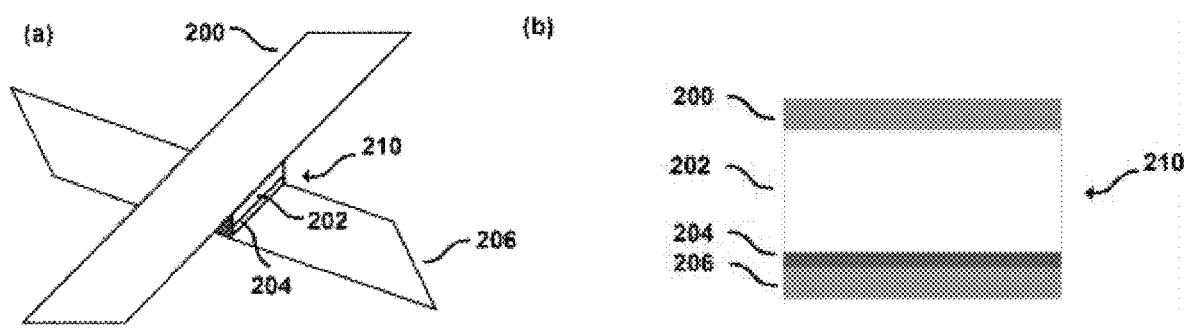
FIG. 2 illustrates a cross sectional view of the inert-inert electrode cell.

FIGS. 2 (a) and (b) is a 3-D and 2-D cross sectional view of inert-inert electrode cell 210 from the prior art. The device comprises top inert electrode 200, electrolyte 202, buffer layer 204, and bottom inert electrode 206. The cell 210 is in crossbar geometry, where the area of crossing point is 100 µm×100 µm. The bottom inert electrode 206 was made of first layer of Al and was evaporated (thickness: 50 nm) onto glass substrate through stencil mask. The ultra-thin buffer layer 204 of $SiO_2$ was sputtered (thickness: 3-5 nm) onto the Al bottom inert electrode 206. And the followed the GeSe layer was evaporated with 100 nm thickness. Then an ultra-thin layer (10 nm) of Ag was evaporated onto the GeSe layer. During this step, as the slow evaporation speed, the Ag was directly dissolved into GeSe, forming AgGeSe layer of electrolyte 202. Finally, the Al top inert electrode 200 was evaporated (thickness: 100 nm) onto the top of thin film.

Figure 3:
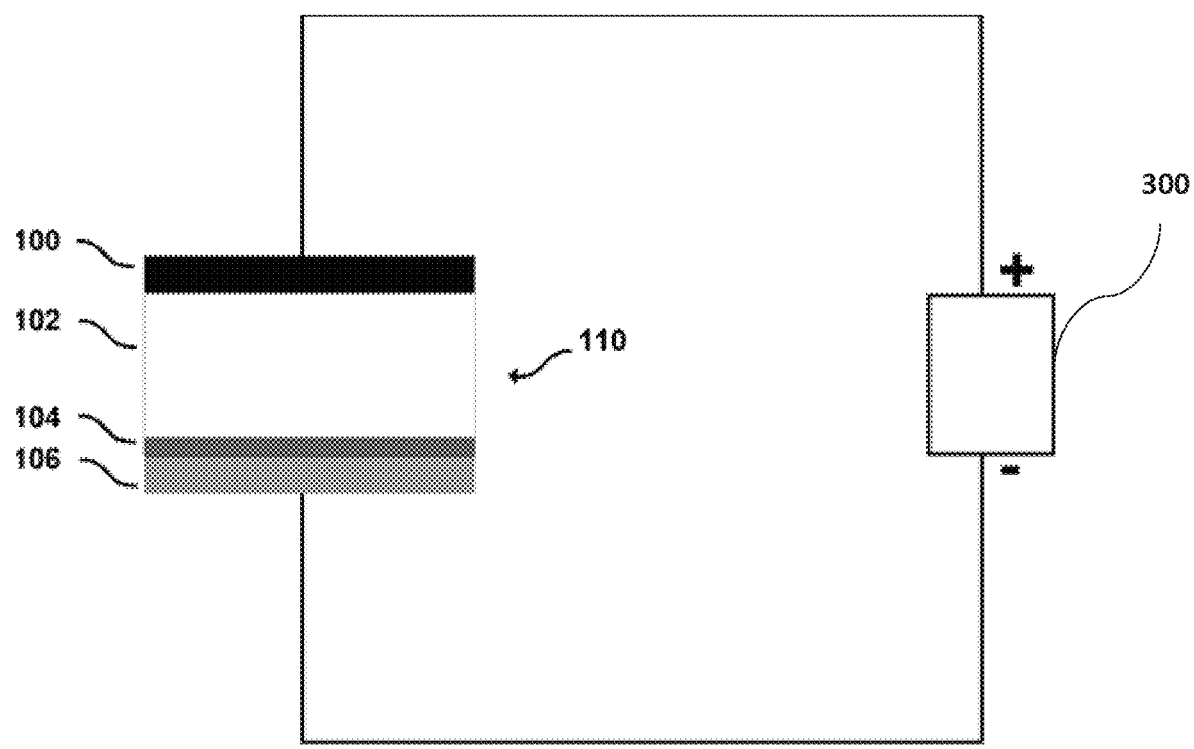
FIG. 3 illustrates a circuit of the active-inert electrode cell.

FIG. 3 is the circuit of inert-active electrode cell from the prior art. The top active electrode 100 is connected with a positive electrode of voltage source 300 and bottom inert electrode 106 is connected with the negative electrode of voltage source 300. The voltage source 300 can offer a sweep of voltages from positive to negative polarity.

Figure 4:
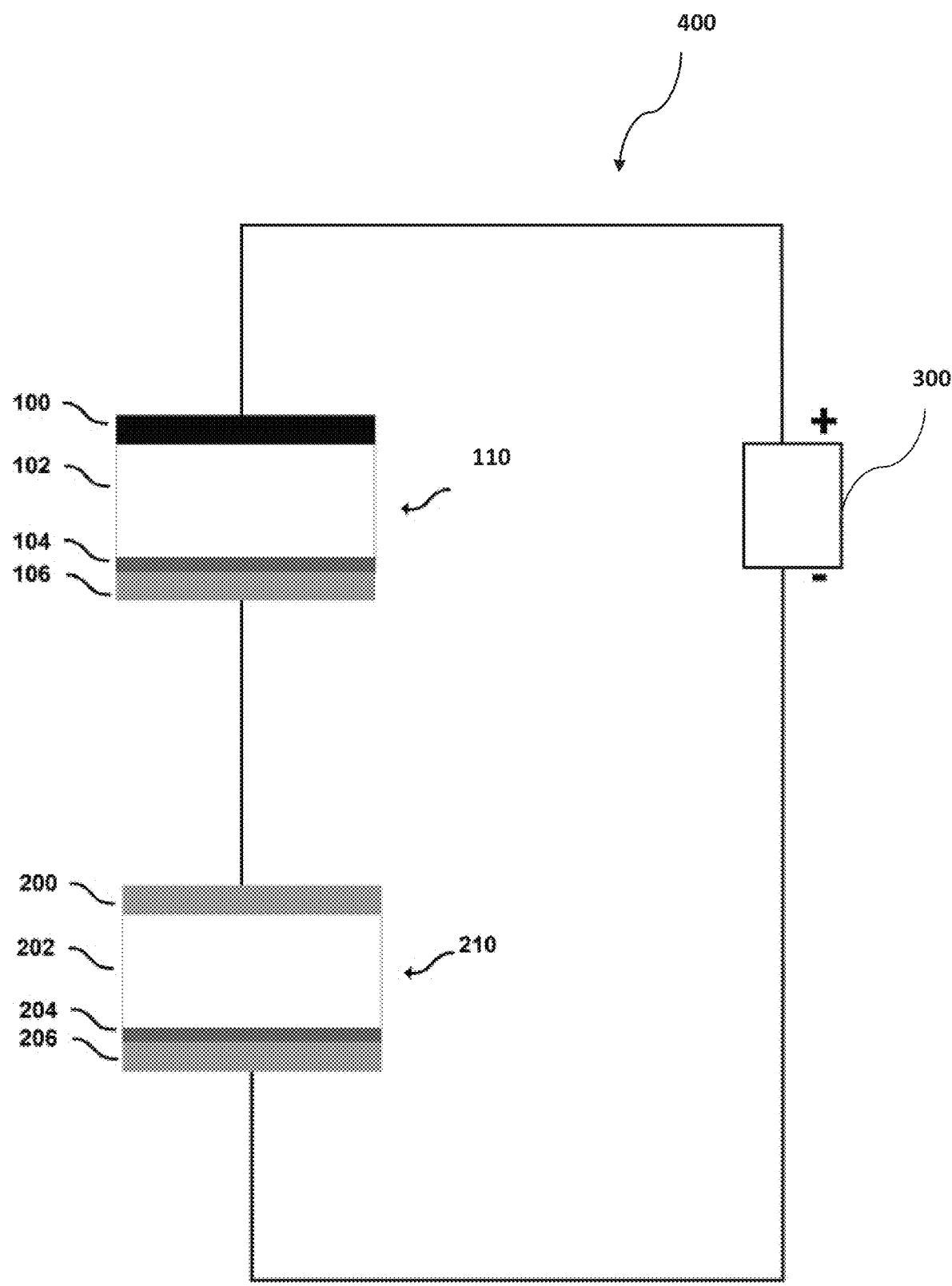
FIG. 4 illustrates a circuit of the inert-active electrode cell and the inert-inert electrode cell in series.

FIG. 4 is the circuit of inert-active electrode cell 110 and inert-inert electrode cell 210 in series representing a random access memory device 400 according to present invention. The inert-active electrode cell 110 has been switched to low resistance in FIG. 3. Two cells 110, 210 are joined in series. The top active electrode 100 of inert-active electrode cell 110 is connected with positive electrode of voltage source 300. And the bottom inert electrode 106 of inert-active electrode cell 110 is connected with the top inert electrode 200 of inert-inert electrode cell 210. And the bottom inert electrode 206 of an inert-inert electrode cell 210 is connected with the negative electrode of voltage source 300. In method 1: During DC sweeping, the filament in inert-active electrode cell 110 is not dissolved. And the filament formation and dissolution is only taken place in the inert-inert electrode cell 210. In method 2: During the SET operation of the device 400, the filament is formed in both of inert-active electrode cell 110 and inert-inert electrode cell 210.

Figure 5:
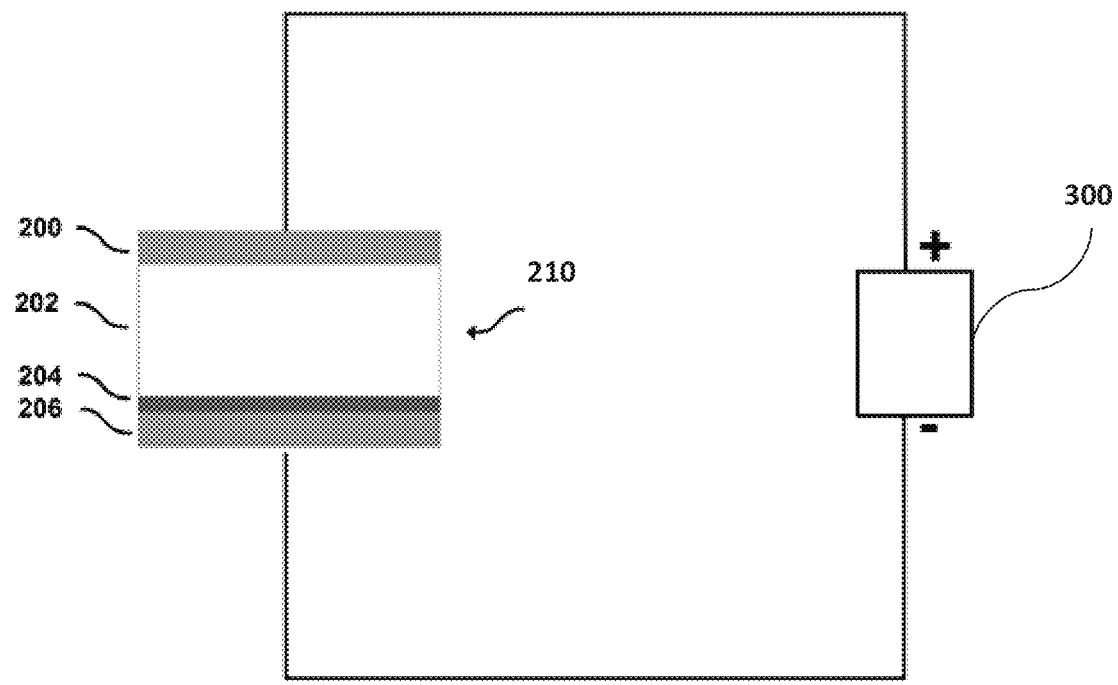
FIG. 5 illustrates a circuit of the inert-inert electrode cell.

FIG. 5 is a circuit of inert-inert electrode cell 210. The top inert electrode 200 and bottom inert electrode 206 are connected with the positive and negative electrode of voltage source 300, respectively. In method 1: The inert-inert electrode cell 210 is the inert-inert electrode cell 210 after RESET operation in FIG. 4. The inert-inert electrode cell 210 contains residue filament, which can be treated as Ag electrode. In method 2: the inert-inert electrode cell 210 contains filament after SET operation in FIG. 4. Therefore, it is needed for RESET operation to recover to high resistance state, then switched between high and low resistance.

Figure 6:
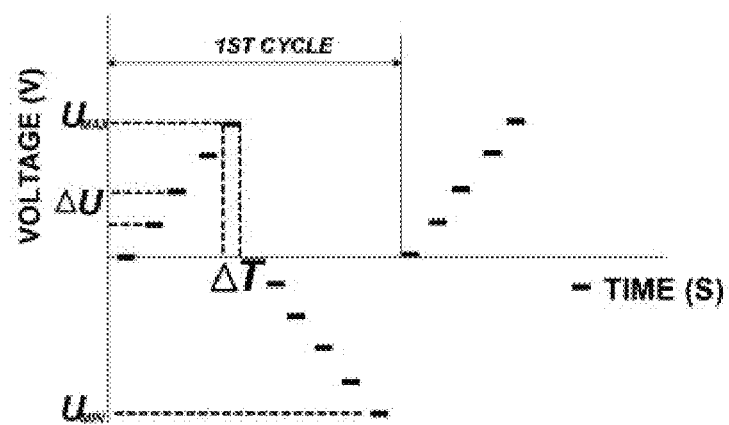
FIG. 6 illustrates a schematic picture I-t curve of DC sweep.

FIG. 6 is a schematic picture I-t curve of DC sweep. The maximum voltage is referred as $U_{MAX}$ and the minimum voltage is referred as $U_{MIN}$. The voltage step is referred as $\Delta U$, and the interval of voltage pulse is referred as $\Delta T$. one cycle contains one positive DC sweep and one negative DC sweep.

Figure 7:
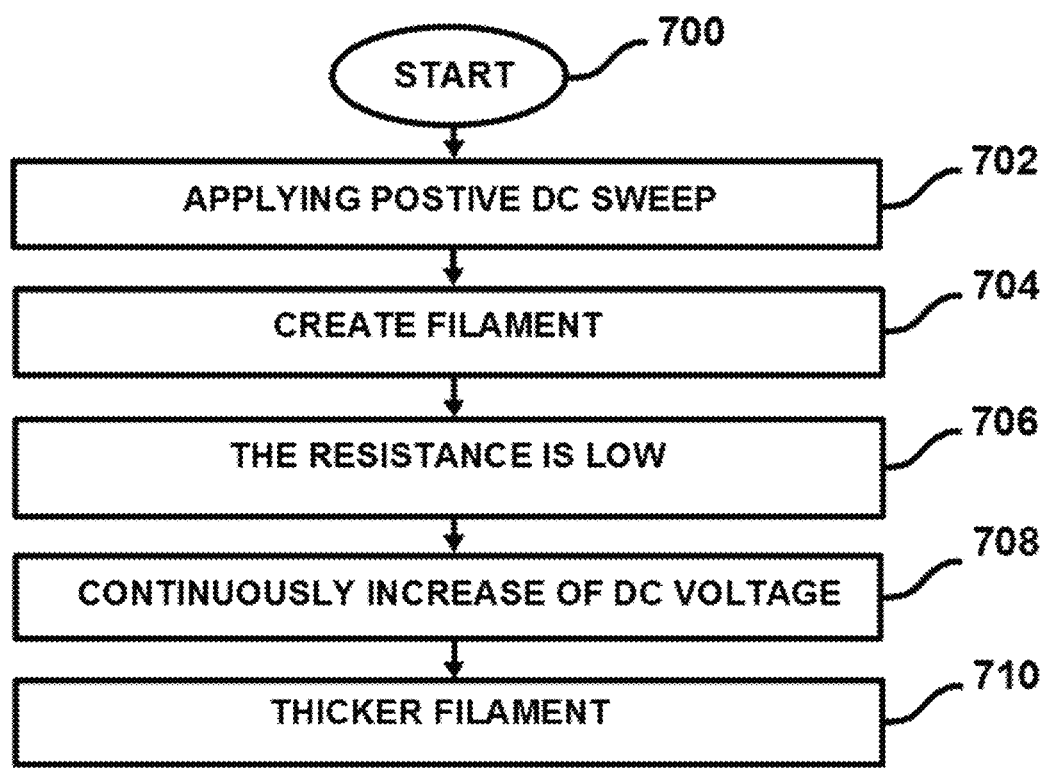
FIG. 7 illustrates a flow chart of mechanism of filament forming in a device with the inert-active electrode cell (method 1)

FIG. 7 is a flow chart of mechanism of filament forming in inert-active electrode cell 110 (method 1). Initially, the DC sweep starts from 0V 700 to positive level 702, until the filament is formed 704 in inert-active electrode cell 110. At this time, the resistance turned to be low 706. Then the DC voltage continuously to increase 708, to get a thicker filament 710.

Figure 8:
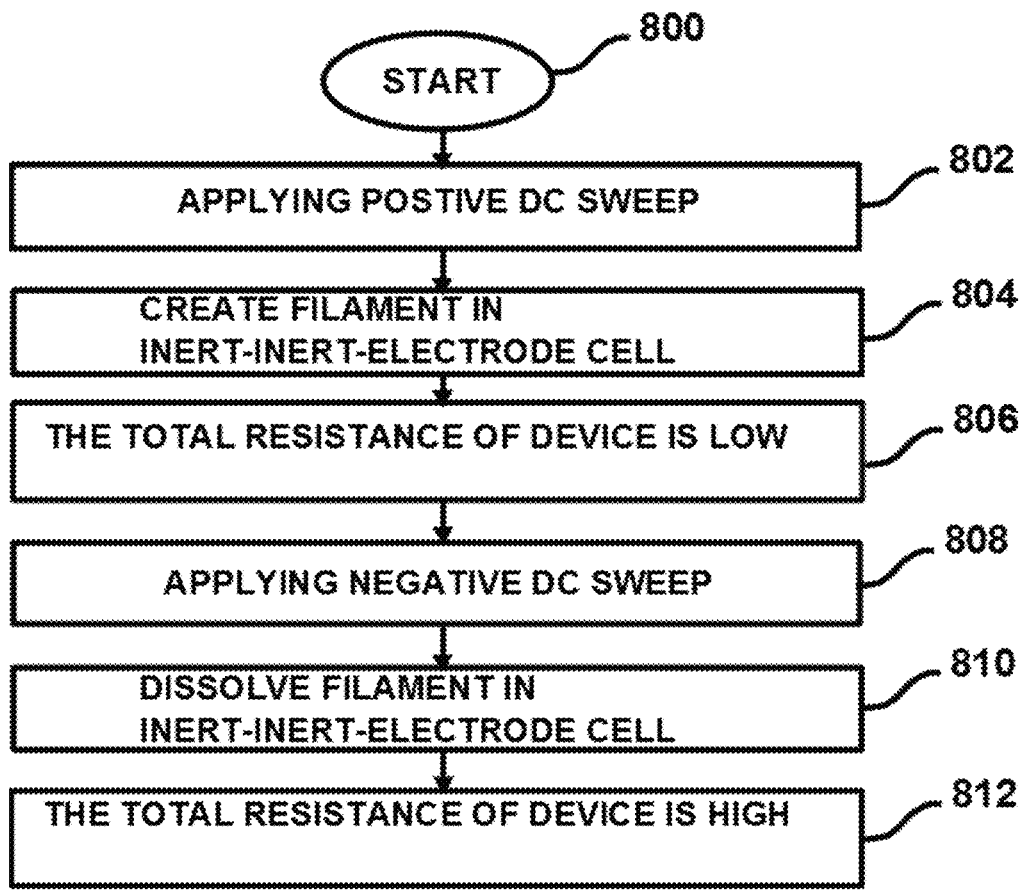
FIG. 8 illustrates a flow chart of mechanism of filament in the device with inert-active electrode cell and the inert-inert electrode cell (method 1)

FIG. 8 is a flow chart of mechanism of filament forming in inert-active electrode cell 110 and inert-inert electrode cell 210 (method 1). It comprises inert-inert electrode cell 210 and inert-inert electrode cell 210 in series. Initially, DC sweep starts from 0V 800 to positive level 802, until the creation of filaments in the inert-inert electrode cell 210. At this time, as resistances of inert-active electrode cell 110 and inert-inert electrode cell 210 are low, the total resistance of device is low 806. Afterwards, the DC sweep starts from 0V to negative level 808. The voltage decrease until the filaments in inert-active electrode cell 110 is dissolved 810. At this time, as the resistance of inert-inert electrode cell 210 is high, the total resistance of device 400 is high 812.

Figure 9:
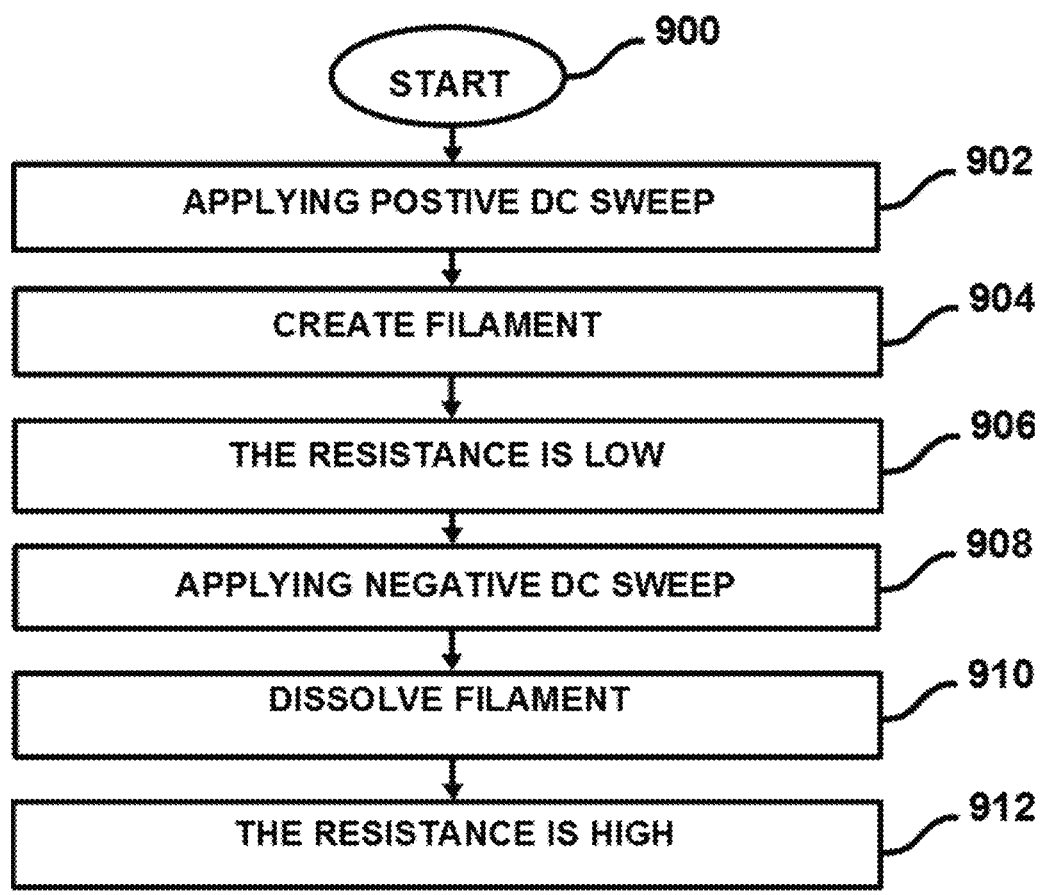
FIG. 9 illustrates a flow chart of mechanism of filament forming in the device with the inert-inert electrode cell (method 1)

FIG. 9 is a flow chart of mechanism of filament forming in the device 400 with inert-active electrode cell 110 and inert-inert electrode cell 210 (method 1). Initially, the DC sweep starts from 0V 900 to positive level 902, until the filaments are formed 904. At this time, the resistance is low 906. Afterwards, the positive sweep stops and negative DC sweep 908 begins from 0V until the filament is dissolved 910. And the corresponding resistance is high 912.

Figure 10:
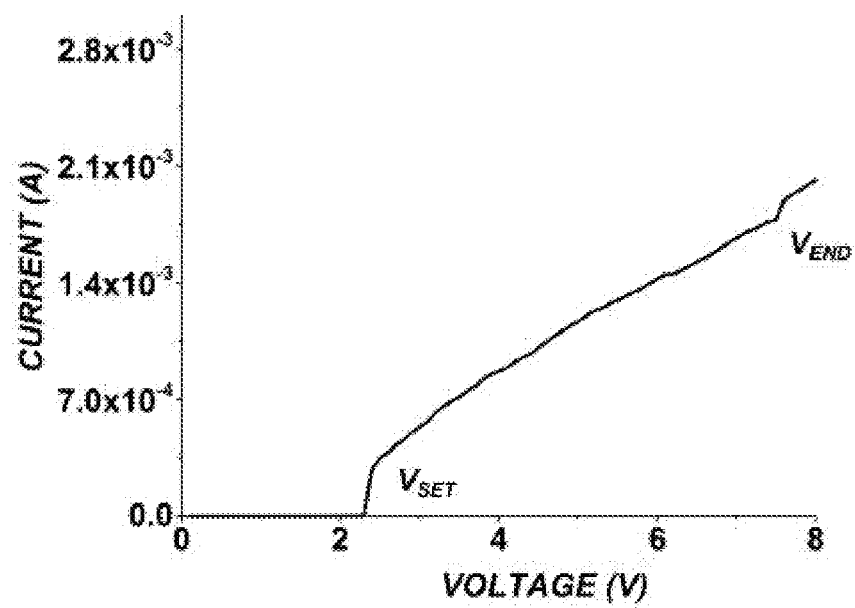
FIG. 10 illustrates I-V curve of SET operation of the inert-active electrode cell.

FIG. 10 is I-V curve of SET operation of inert-active electrode cell 110 (method 1). Initially, the voltage gradually increases form 0V till $V_{SET}$. At the voltage $V_{SET}$, the current of cell increase and corresponding resistance is decreased to low resistance state. The voltage will continuously increase up to $V_{END}$. At the voltage $V_{END}$, the filaments grow to be thicker than those under voltage under $V_{SET}$. The voltage $V_{END}$ can be 4-5 times larger than those under $V_{SET}$.

Figure 11:
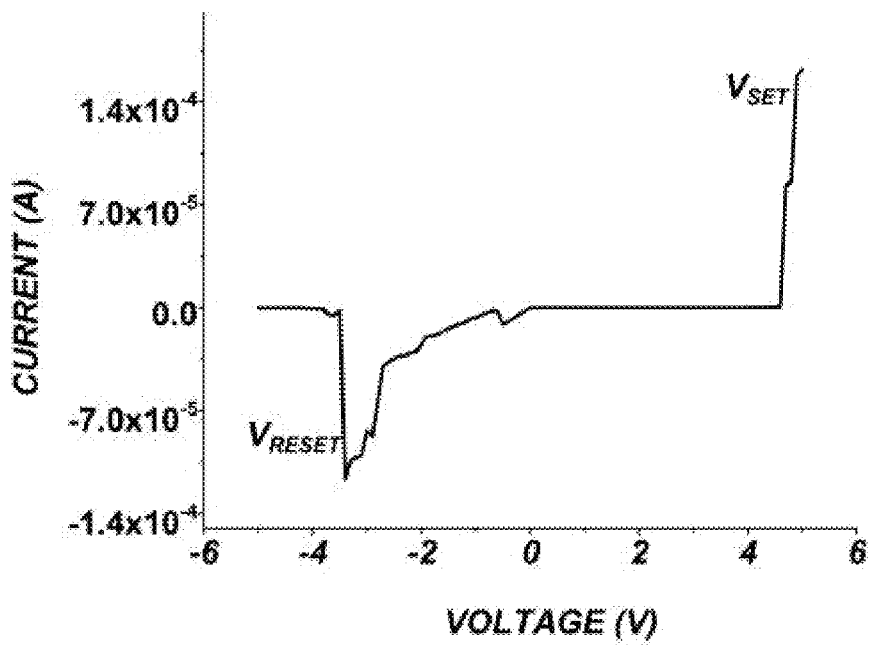
FIG. 11 illustrates I-V curve of circuit of the inert-active electrode cell and the inert-inert electrode cell in series (method 1)

FIG. 11 is I-V curve of circuit of device 400 (method 1). Initially, the voltage increase from 0V. Till $V_{SET}$, the current increases, and the resistance decreases. After that, the DC sweeps start to decrease from 0V. Until $V_{RESET}$, the absolute value of current decreases and filaments are dissolved.

Figure 12:
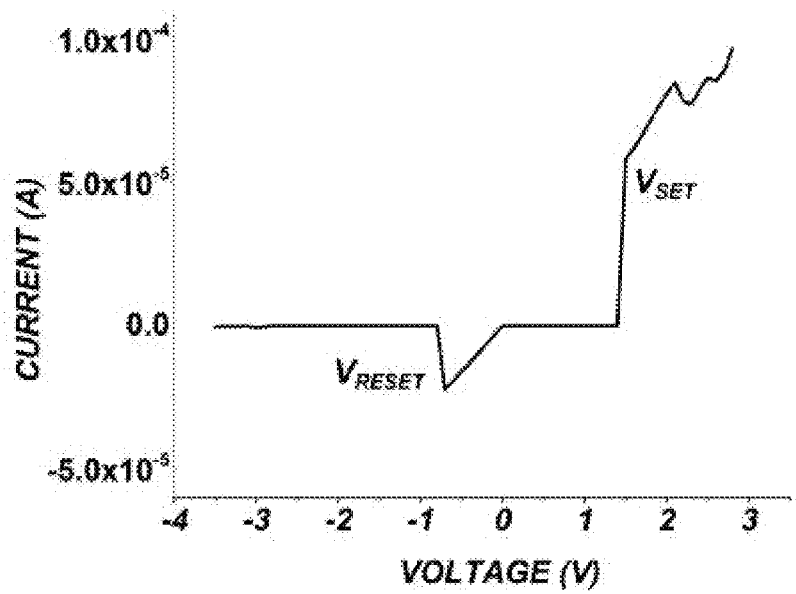
FIG. 12 illustrates I-V curve of inert-inert electrode cell (method 1)

FIG. 12 is the I-V curve of inert-inert electrode cell 210 (method 1). The inert-inert electrode cell 210 has been reset to high resistance state in the circuit of FIG. 11. The residue Ag filaments behave as Ag electrode. The DC sweep starts from 0V. At $V_{SET}$, the current and resistance are increased and decreased respectively. And the filament is formed. After that, the DC sweep start from 0V to negative value. At $V_{RESET}$, the absolute value of current is decreased and resistance is increased. The corresponding filaments are dissolved.

Figure 13:
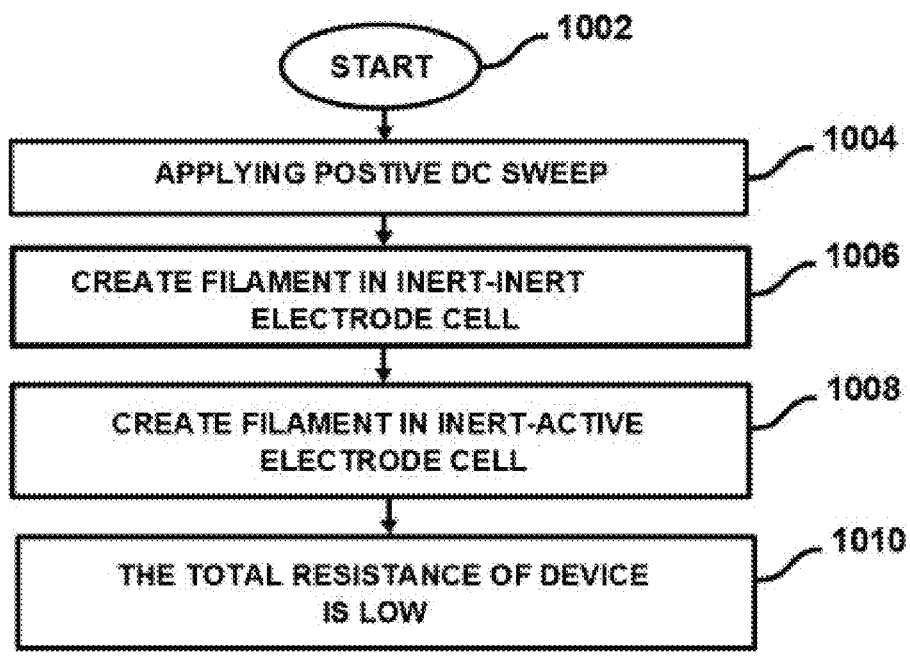
FIG. 13 illustrates a flow chart of mechanism of filament forming in the device with the inert-active electrode cell and the inert-inert electrode cell (method 2)

FIG. 13 is a flow chart of SET operation in the device 400 with inert-active electrode cell 110 and inert-inert electrode cell 210 (method 2). Initially, DC sweep starts from 0V 1002 to positive level 1004. Until the SET voltage ($V_{SET}$), the filament is firstly created in the inert-inert electrode cell 210, then in the inert-active electrode cell 110. The current of device 400 increase and corresponding resistance is decreased to low resistance state 1010.

Figure 14:
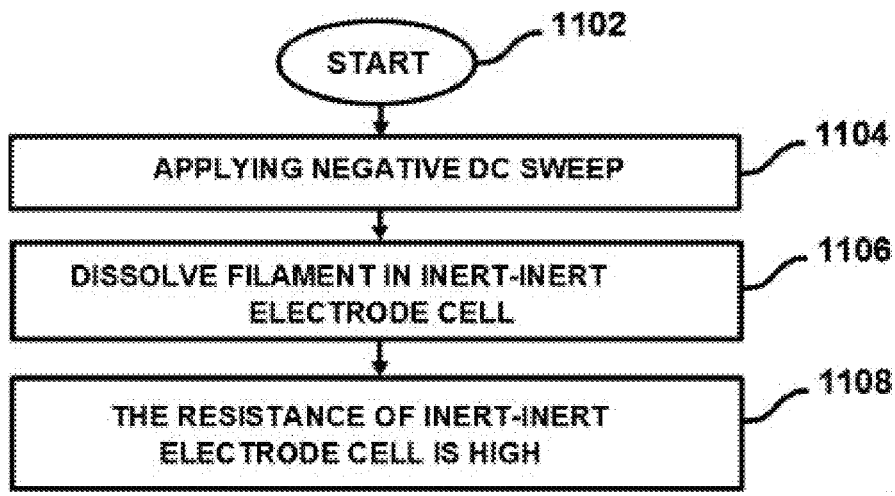
FIG. 14 illustrates a flow chart of RESET operation in the device with the inert-inert electrode cell (method 2)

FIG. 14 is a flow chart of RESET operation of the inert-inert electrode cell 210 (method 2). The inert-inert electrode cell 210 has been set to low resistance from the SET operation in the circuit of FIG. 13. Initially, DC sweep starts from 0V 1102 to negative level 1104. At $V_{RESET}$, the absolute value of current is decreased and resistance is increased. The corresponding filaments are dissolved. The inert-inert electrode cell 210 is reset to high resistance 1108.

Figure 15:
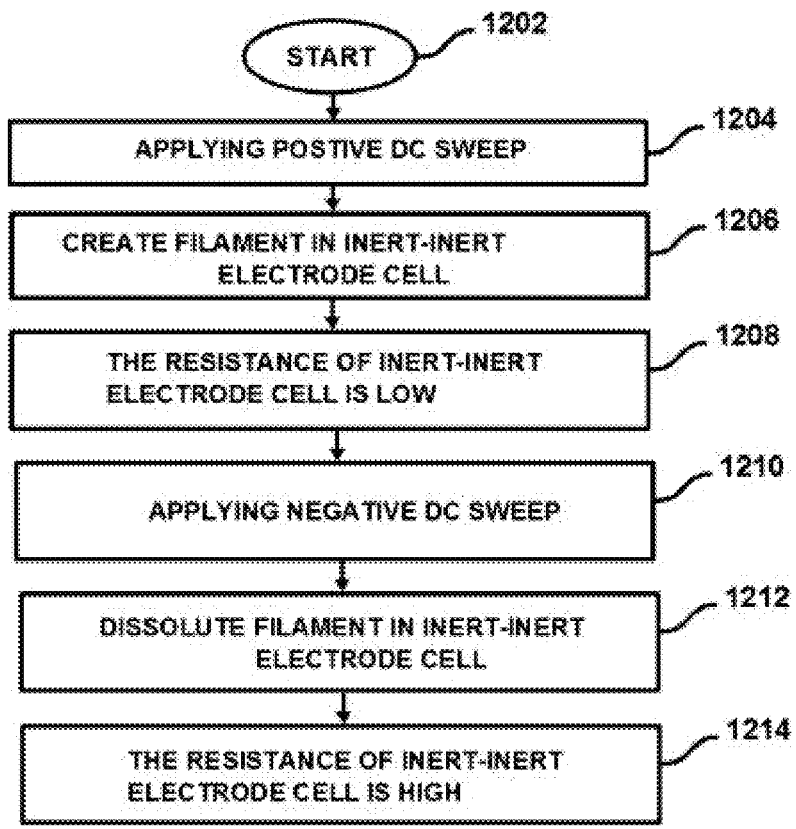
FIG. 15 illustrates a flow chart of mechanism of filament formation and dissolution in the inert-inert electrode cell (method 2)

FIG. 15 is a flow chart of mechanism of filament formation and dissolution in the inert-inert electrode cell 210 (method 2). The inert-inert electrode cell 210 has been set to high resistance state from RESET operation in FIG. 14. Initially, the voltage increase from 0V 1202 to positive level. Till $V_{SET}$, the filaments are created 1206, and the current increases, and the resistance decreases 1208. After that, the DC sweeps start from 0V to negative level 1210. Until $V_{RESET}$, the absolute value of current decreases and filaments are dissolved 1212. The inert-inert electrode cell 210 is reset to high resistance 1214.

Figure 16:
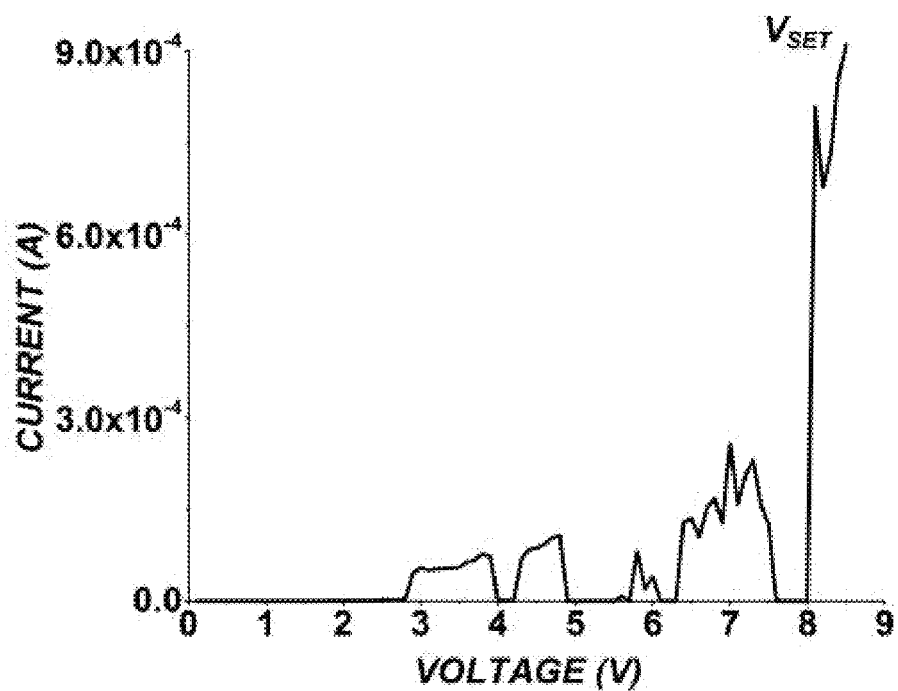
FIG. 16 illustrates I-V curve of SET operation of the device with the inert-inert electrode cell and the inert-active electrode cell (method 2)

FIG. 16 is I-V curve of SET operation of device 400 with inert-inert electrode cell 210 and inert-active electrode cell 110 (method 2). Initially, the voltage gradually increases form 0V till $V_{SET}$. At the voltage $V_{SET}$, the current of device 400 increase and corresponding resistance of device 400 is decreased to low resistance state.

Figure 17:
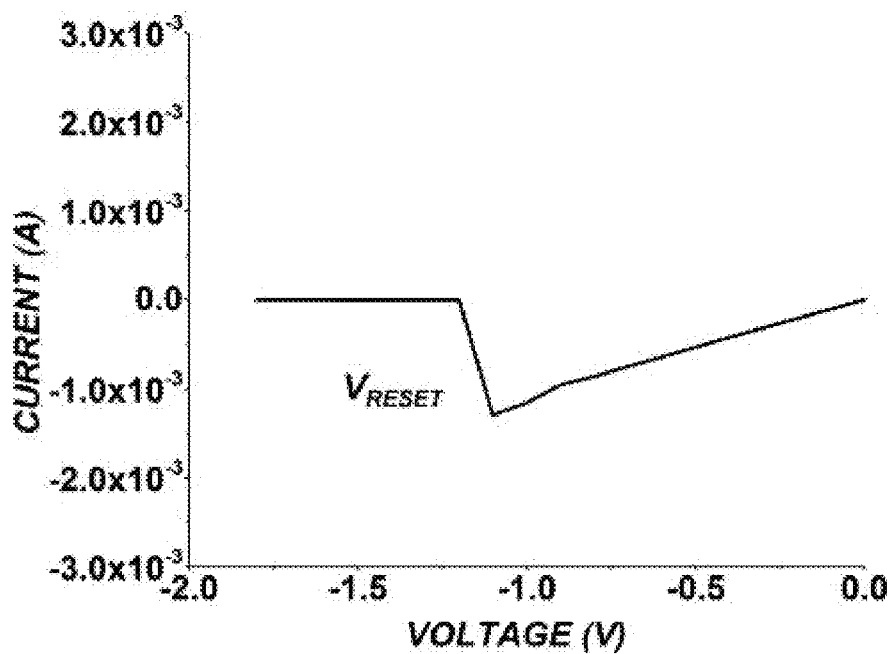
FIG. 17 illustrates I-V curve of RESET operation of the inert-active electrode cell.

FIG. 17 is I-V curve of RESET operation of inert-active electrode cell 110 (method 2). Initially, the voltage gradually decreases form 0V till $V_{RESET}$. At the voltage $V_{RESET}$, the absolute value of current decrease and corresponding resistance is increased to high resistance state.

Figure 18:
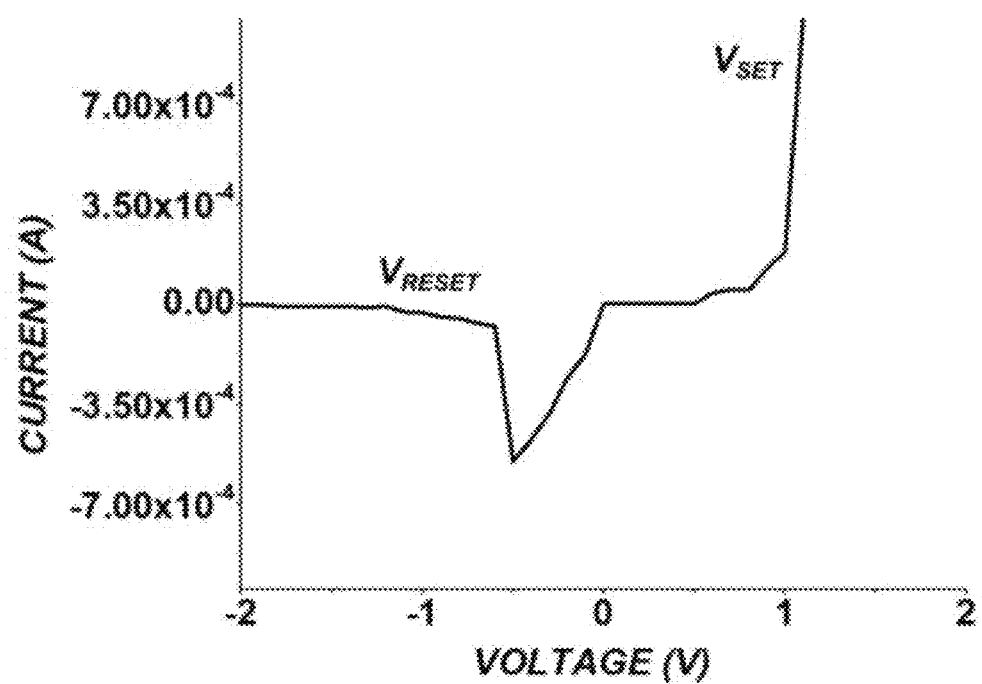
FIG. 18 illustrates the I-V curve of the inert-inert electrode cell (method 2).

FIG. 18 is the I-V curve of inert-inert electrode cell 210 (method 2). It has been reset in the circuit of FIG. 11 and in the I-V curve of FIG. 17. The residue Ag filaments behave as Ag electrode. The DC sweep starts to increase from 0V. At $V_{SET}$, the current and resistance are increased and decreased, respectively. And the filament is formed. After that, the DC sweep start from 0V to negative value. At $V_{RESET}$, the absolute value current is decreased and resistance is increased. The corresponding filaments are dissolved.

The invention claimed is:

1. A method of forming a metallic conductive filament during the initial cycle electro-forming process of an electrochemical metallisation ECM based memory cell device characterized in that the device comprises an inert-inert electrode cell (210) and an inert-active electrode cell (110), the inert-inert electrode cell (210) and the inert-active electrode cell (110) are connected in series in a serial connection, the inert-inert electrode cell (210) comprises a bottom inert electrode (206) which is connected with a negative electrode of a voltage source (300) and the inert-active electrode cell (110) comprises a top active electrode (100) which is connected with a positive electrode of the voltage source (300), wherein in the first step the inert-active electrode cell (110) is preset to low resistance under a positive bias which is higher than the SET threshold bias in a separated circuit, in the second step the inert-inert electrode cell (210) is switched from high resistance state to low resistance state at the SET threshold positive bias, the metallic ions in an electrolyte (202) of the inert-inert electrode cell (210) are reduced to the filament, the bottom inert electrode (106) in the inert-active electrode cell (110) is oxidized into metallic ions and migrated into electrolyte (102), wherein the filament in the inert-active electrode cell (110) is thicker that the filament in the inert-inert electrode cell (210), and the filament in the inert-inert electrode cell (210) dissolves other than the filament in the inert-active electrode cell (110), being switched to high resistance state during RESET process.

2. A method of forming a metallic conductive filament during the initial cycle electro-forming process of an electrochemical metallisation ECM based memory cell device characterized in that the device an inert-inert electrode cell (210) and an inert-active electrode cell (110), the inert-inert electrode cell (210) and the inert-active electrode cell (110) are connected in series in a serial connection, the inert-inert electrode cell (210) comprises a bottom inert electrode (206) which is connected with a negative electrode of a voltage source (300) and the inert-active electrode cell (110) comprises a top active electrode (100) which is connected with a positive electrode of a voltage source (300), wherein in the first step the inert-active electrode cell (110) is maintained in the original high resistance state, during the SET process both the inert-inert electrode cell (210) and the inert-active electrode cell (110) are switched to low resistance state, in the second step after the SET process the inert-inert electrode cell (210) has to be reset to high resistive state individually in a separated circuit and then it switches between high and low resistance states continuously in the separated circuit.

* * * * *